US010358712B2

(12) United States Patent
Kimura et al.

(10) Patent No.: US 10,358,712 B2
(45) Date of Patent: Jul. 23, 2019

(54) SURFACE-COATED CUTTING TOOL AND METHOD OF MANUFACTURING THE SAME

(71) Applicant: MITSUBISHI MATERIALS CORPORATION, Tokyo (JP)

(72) Inventors: Takashi Kimura, Naka (JP); Masakuni Takahashi, Anpachi-gun (JP); Kazuaki Senbokuya, Naka (JP); Tatsuo Hashimoto, Akashi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 139 days.

(21) Appl. No.: 15/508,298

(22) PCT Filed: Sep. 3, 2015

(86) PCT No.: PCT/JP2015/075072
§ 371 (c)(1),
(2) Date: Mar. 2, 2017

(87) PCT Pub. No.: WO2016/035854
PCT Pub. Date: Mar. 10, 2016

(65) Prior Publication Data
US 2017/0283936 A1    Oct. 5, 2017

(30) Foreign Application Priority Data

Sep. 3, 2014    (JP) ................. 2014-178723

(51) Int. Cl.
*B23B 27/14*    (2006.01)
*C23C 14/14*    (2006.01)
(Continued)

(52) U.S. Cl.
CPC .............. *C23C 14/14* (2013.01); *B23B 27/14* (2013.01); *B23B 27/148* (2013.01); *B23B 51/00* (2013.01);
(Continued)

(58) Field of Classification Search
USPC ........... 51/307, 309; 428/336, 697, 698, 699
See application file for complete search history.

(56) References Cited

U.S. PATENT DOCUMENTS

2002/0168552 A1* 11/2002 Yamamoto .......... C23C 14/0641
428/697
2014/0169891 A1    6/2014 Kohlscheen

FOREIGN PATENT DOCUMENTS

CN    1110051 A    10/1995
CN    1278307 A    12/2000
(Continued)

OTHER PUBLICATIONS

Godinho et al "Characterization of Ti(1–x)Al(x)N coatings with selective IR reflectivity" Solar Energy 84 (2010) p. 1397-1401. (Year: 2010).*

(Continued)

*Primary Examiner* — Archene A Turner
(74) *Attorney, Agent, or Firm* — Locke Lord LLP; James E. Armstrong, IV; Nicholas J. DiCeglie, Jr.

(57) ABSTRACT

This surface-coated cutting tool includes a cutting tool body made of tungsten carbide-based cemented carbide and a hard coating layer deposited on a surface of the cutting tool body, in which the hard coating layer has at least one $(Ti_{1-x}Al_x)N$ layer ($0.4 \leq X \leq 0.7$, X is an atomic ratio) with an average layer thickness of 0.5 to 10 μm, the (Ti, Al)N layer has a cubic crystal structure, and Ia−Ib<5 is satisfied when Ia (%) is an average absorptance of the hard coating layer at a wavelength of 400 to 500 nm and Ib (%) is an average absorptance of the hard coating layer at a wavelength of 600 to 700 nm.

3 Claims, 3 Drawing Sheets

(51) Int. Cl.
  B23B 51/00    (2006.01)
  B23C 5/16     (2006.01)
  B23P 15/28    (2006.01)
  C23C 14/06    (2006.01)
  C23C 14/24    (2006.01)
  C23C 14/32    (2006.01)
  B23C 5/10     (2006.01)

(52) U.S. Cl.
  CPC ............... *B23C 5/16* (2013.01); *B23P 15/28* (2013.01); *C23C 14/06* (2013.01); *C23C 14/24* (2013.01); *C23C 14/32* (2013.01); *B23B 2222/28* (2013.01); *B23B 2224/24* (2013.01); *B23B 2228/08* (2013.01); *B23B 2228/105* (2013.01); *B23C 5/1009* (2013.01); *B23C 2222/28* (2013.01); *B23C 2224/24* (2013.01); *B23C 2228/08* (2013.01); *B23C 2228/10* (2013.01)

(56) References Cited

FOREIGN PATENT DOCUMENTS

| CN | 103128326 A | 6/2013 |
| JP | 07-243047 A | 9/1995 |
| JP | 09-291353 A | 11/1997 |
| JP | 10-225804 A | 8/1998 |
| JP | 2000-218409 A | 8/2000 |
| JP | 2008-264890 A | 11/2008 |
| JP | 2013-023741 A | 2/2013 |
| WO | 2009/116552 A1 | 9/2009 |
| WO | 2014/157688 A1 | 10/2014 |

OTHER PUBLICATIONS

R. Rachbauer et al., "Temperature driven evolution of thermal, electrical, and optical properties of Ti—Al—N coatings" Acta Materialia Elsevier Science Ltd. UK, vol. 60, No. 5, Mar. 2012, pp. 2091-2096. (cited in the Jan. 8, 2018 EP Search Report).

A. Horling et al., "Mechanical properties and machining performance of Ti1—xAlxN-coated cutting tools", Surface and Coatings Technology, Elsevier BV, Amsterdam, NL, vol. 191, No. 2-3, Feb. 21, 2005, pp. 384-392. (cited in the Jan. 8, 2018 EP Search Report).

M. Zlatanovic et al., "Structural, mechanical and optical properties of TiN and (Ti, Al)N coatings", Third Yugoslav Materials Research Society Conference—Sep. 20-24, 1999; In: Materials Science Forum; ISSN 0255-5476; vol. 352; Trans Tech Publ, CH, vol. 352, Jan. 1, 2000, pp. 35-42. (cited in the Jan. 8, 2018 EP Search Report).

M. Zlatanovic et al., "Influence of magnetic field configuration on the deposition conditions in an unbalanced magnetron system", Surface and Coatings Technology, Elsevier BV, Amsterdam, NL, vol. 90, No. 1-2, Mar. 15, 1997, pp. 143-149. (cited in the Jan. 8, 2018 EP Search Report).

Search Report dated Jan. 8, 2018, issued for the European patent application No. 15837682.2.

Office Action dated Jan. 17, 2018, issued for the Chinese patent application No. 201580046830.0 and a partial English translation of the Search Report.

International Search Report dated Nov. 17, 2015, issued for PCT/JP2015/075072 and English translation thereof.

\* cited by examiner

SURFACE-COATED CUTTING TOOL AND METHOD OF MANUFACTURING THE SAME

TECHNICAL FIELD

The present invention relates to a surface-coated cutting tool (hereinafter, also referred to as a coated tool) that exhibits excellent wear resistance for a long time by virtue of a hard coating layer having excellent oxidation resistance and high-temperature hardness, and a method of manufacturing the surface-coated cutting tool.

Priority is claimed on Japanese Patent Application No. 2014-178723, filed on Sep. 3, 2014, the content of which is incorporated herein by reference.

BACKGROUND ART

In general, surface-coated cutting tools include: inserts used by being detachably attached to a tip end portion of a tool bit in turning or planing of a work material such as various steels and cast irons; drills that used in drilling of the work material and miniature drills; and solid end mills used in face milling, groove machining, shoulder machining, or the like of the work material. Insert-type end mill tools with the insert detachably attached thereto that perform cutting in the same manner as in the solid end mills, are also known as coated tools.

In addition, in view of excellent wear resistance, coated tools including a complex nitride of Ti and Al (hereinafter, indicated by (Ti, Al)N) as a hard coating layer formed by coating using an arc ion plating (hereinafter, indicated by "AIP") method, which is a type of physical vapor deposition, on a surface of a tool body made of tungsten carbide-based cemented carbide, are known.

For example, PTL 1 discloses that by depositing, on a surface of a tool body, a hard coating layer including a reformed (Ti, Al)N layer that includes a (Ti, Al)N layer satisfying a composition formula: $(Ti_{1-X}Al_X)N$ (where X ranges from 0.40 to 0.60 in terms of atomic ratio) and that has such a crystal arrangement that in a case where the (Ti, Al)N layer is subjected to crystal orientation analysis by an electron backscatter diffraction apparatus, 50% or more in area is shared by crystal grains having a crystal orientation of <111> within the range from 0 to 15 degrees from the normal to the polished surface, and in a case where the angle formed between adjoining crystal grains is measured, the rate of the small-angle grain boundary ($0<\theta \leq 15°$) is 50% or more, a coated tool in which the hard coating layer exhibits excellent fracturing resistance in high-speed heavy cutting can be obtained.

PTL 2 discloses a coated tool improved in adhesion and wear resistance of a hard coating layer in cutting of high-hardness steel having a Rockwell hardness of more than 50 (C-scale) by regulating the value of I(200)/I(111) to 2.0 or less when the diffraction intensity of (111) plane and the diffraction intensity of (200) plane are represented by I(111) and I(200), respectively, in X-ray diffraction of the hard coating layer in an end mill coated with (Ti, Al)N, complex carbonitride, and carbide of Ti and Al.

PTL 3 discloses that a coated tool has excellent cutting characteristics by virtue of a nitride hard coating film made to have 7.5YR to 10Y hue, 3 to 8 lightness, and 2 to 8 saturation by Mansell color charts by changing a nitrogen content in a film of compounds of Ti and/or Ti and Al and/or group 4A, 5A, and 6A metals.

CITATION LIST

Patent Literature

[PTL 1] Japanese Unexamined Patent Application, First Publication No. 2008-264890
[PTL 2] Japanese Unexamined Patent Application, First Publication No. H9-291353
[PTL 3] Japanese Unexamined Patent Application, First Publication No. H7-243047

SUMMARY OF INVENTION

Technical Problem

In recent years, performance of cutting machine tools has been significantly improved, and there is a strong demand for power saving, energy saving, and cost reduction in cutting. In addition, there is a tendency that cutting speed is increased. For example, there are no problems in a case where a conventional coated tool having a (Ti, Al)N layer deposited as a hard coating layer is used in cutting of steel or cast iron under normal conditions. However, particularly, in a case of using such a conventional coated tool, cutting is performed in a high-temperature oxidation atmosphere (for example, in a state in which the temperature rises due to the cutting), and the coating easily deteriorates since the hard coating layer does not have sufficient oxidation resistance. Therefore, it is not possible to sufficiently exhibit wear resistance in long-term usage. As a result, the tool life is reached after a relatively short period of time.

Solution to Problem

Accordingly, from the above-described viewpoint, the inventors intensively have studied to develop a coated tool that has a hard coating layer with excellent oxidation resistance and high-temperature hardness during cutting in a high-temperature oxidation atmosphere, and exhibits excellent wear resistance in long-term usage. As a result, they have obtained the following knowledge.

There is a method of increasing a content ratio of Al in order to improve high-temperature hardness and oxidation resistance of a hard coating layer in a coated tool having the hard coating layer composed of a (Ti, Al)N layer. In this case, in a case where the content ratio of Al is greater than 70 atom %, the crystal structure is likely to be a hexagonal crystal structure, and as a result, the hardness is reduced, and thus it becomes difficult to balance the high-temperature hardness and the oxidation resistance.

The inventors have formulated a hypothesis for improving oxidation resistance while maintaining high-temperature hardness in place of the measure for improving the oxidation resistance by adjusting the amount of an element constituting the (Ti, Al)N layer, and intensively studied to demonstrate the hypothesis. As a result, the inventors have experimentally found that in the measurement of an optical absorption spectrum of a surface of a hard coating layer of a coated tool using a spectrophotometer, in a case where Ia (%) is an average absorptance at a wavelength of 400 to 500 nm, Ib (%) is an average absorptance at a wavelength of 600 to 700 nm, and a predetermined relationship: Ia−Ib<5 is established therebetween, the hard coating layer has excellent high-temperature hardness and exhibits excellent oxidation resistance.

Accordingly, in a case of a coated tool having a hard coating layer deposited thereon, in which regarding an optical absorption spectrum of a surface of the hard coating layer, the above-described predetermined relationship: Ia−Ib<5 is established, even in a case where cutting is performed in a high-temperature oxidation atmosphere, the hard coating layer does not deteriorate since the hard coating layer has excellent oxidation resistance. Therefore, the inventors have found that excellent wear resistance is exhibited in long-term usage.

The present invention is contrived based on the above-described knowledge, and is provided with the following configuration.

(1) A surface-coated cutting tool including: a cutting tool body made of tungsten carbide-based cemented carbide; and a hard coating layer deposited on a surface of the cutting tool body, in which (a) the hard coating layer has at least one (Ti, Al)N layer with an average layer thickness of 0.5 to 10 μm, in a case where a composition of the (Ti, Al)N layer is expressed by a composition formula: $(Ti_{1-x}Al_x)N$, X is an atomic ratio which satisfies 0.4≤X≤0.7, and the (Ti, Al)N layer has a cubic crystal structure, and (b) in a case where an optical absorption spectrum of a surface of the hard coating layer is measured using a spectrophotometer, Ia (%) is an average absorptance at a wavelength of 400 to 500 nm, Ib (%) is an average absorptance at a wavelength of 600 to 700 nm, and Ia−Ib<5 is satisfied.

(2) The surface-coated cutting tool according to (1), in which the hard coating layer is produced such that a maximum magnetic flux density gradient when being measured in an arbitrary surface range of 10 mm at a center of a surface of a Ti—Al alloy target is 6 G/mm or greater and a maximum magnetic field magnetic flux density is in the range of 100 to 250 G.

(3) A method of manufacturing a surface-coated cutting tool including a cutting tool body made of tungsten carbide-based cemented carbide and a hard coating layer deposited on a surface of the cutting tool body, in which the hard coating layer has at least one (Ti, Al)N layer, the method comprising: depositing the (Ti, Al)N layer on the surface of the cutting tool body using the Ti—Al alloy target while a maximum magnetic flux density gradient when being measured in an arbitrary surface range of 10 mm at a center of a surface of a Ti—Al alloy target is adjusted to 6 G/mm or greater and a maximum magnetic field magnetic flux density is adjusted to 100 to 250 G.

Advantageous Effects of Invention

In a surface-coated cutting tool of the present invention, in the measurement of an optical absorption spectrum of a surface of a hard coating layer composed of a (Ti, Al)N layer, an average absorptance Ia (%) at a wavelength of 400 to 500 nm and an average absorptance Ib (%) at a wavelength of 600 to 700 nm satisfy a predetermined relationship: Ia−Ib<5. Therefore, even in a case where the cutting is performed under a high-temperature oxidation atmosphere, the surface-coated cutting tool exhibits excellent wear resistance in long-term usage with no deterioration in film characteristics since it has excellent oxidation resistance.

DESCRIPTION OF EMBODIMENTS

Figure 1A:
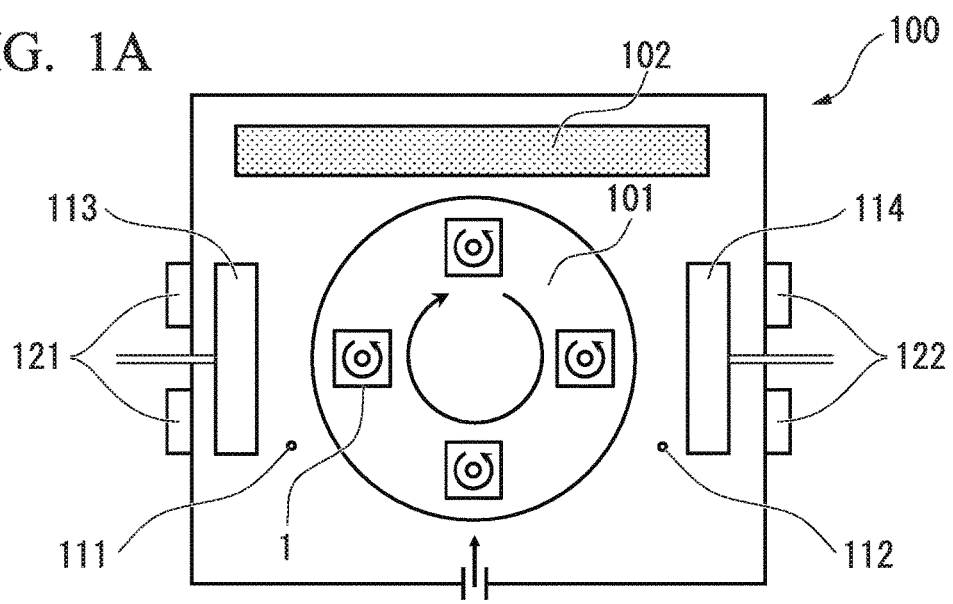
FIG. 1A is a schematic plan view showing an AIP apparatus used for forming a hard coating layer of a surface-coated cutting tool according to an embodiment of the present invention.

Next, a surface-coated cutting tool according to an embodiment of the present invention (hereinafter, referred to as this embodiment) will be described in more detail.

The coated tool of this embodiment is provided with a cutting tool body and a hard coating layer. The hard coating layer is deposited on a surface of the cutting tool body made of tungsten carbide-based cemented carbide. The hard coating layer includes at least one (Ti, Al)N layer (a layer of a complex nitride of Ti and Al) with a cubic crystal structure with an average layer thickness of 0.5 to 10 μm. In a case where the component composition of the layer is expressed by a composition formula: $(Ti_{1-x}Al_x)N$, X is an atomic ratio and satisfies 0.4≤X≤0.7.

In the (Ti, Al)N layer, the Al component acts to improve high-temperature hardness and heat resistance, and the Ti component acts to improve high-temperature toughness and high-temperature strength. However, in a case where a content ratio X (atomic ratio, the same hereinafter) of Al in the total amount of Ti and Al is greater than 0.7, the hard coating layer is not allowed to have a single phase of a cubic crystal structure phase that is excellent in hardness, but allowed to have a mixed phase of a hexagonal crystal structure phase and a cubic crystal structure phase, and thus the hardness is reduced. In a case where the content ratio X of Al in the total amount of Ti and Al is less than 0.4, the content ratio of Al is relatively reduced, and thus the heat resistance is reduced. As a result, the wear resistance deteriorates due to the generation of uneven wear, the generation of thermoplastic deformation, and the like. Accordingly, the content ratio X (atomic ratio) of Al in the total amount of Ti and Al is required to be 0.4 to 0.7. The content ratio X (atomic ratio) of Al in the total amount of Ti and Al is preferably 0.45 to 0.7, and more preferably 0.5 to 0.7, but is not limited thereto.

In a case where the average layer thickness of the (Ti, Al)N layer is less than 0.5 μm, the layer cannot exhibit excellent wear resistance for a long time. In a case where the average layer thickness is greater than 10 μm, chipping easily occurs. Accordingly, the average layer thickness of the (Ti, Al)N layer is required to be 0.5 to 10 μm. This average layer thickness is preferably 0.5 to 8 μm, and more preferably 0.5 to 6 μm, but is not limited thereto.

The inventors have formulated the following hypothesis: in a case where many lattice defects (for example, dislocation) and the like are present in the surface of the hard coating layer, oxygen atoms are easily adsorbed to the lattice defects in a high-temperature oxidation atmosphere during cutting, and thus many starting points for nucleus formation for forming oxides are formed in the surface of the hard coating layer. In this manner, the lattice defects contribute to an improvement in the oxidation resistance of the hard coating layer, and thus cutting performance is improved. Furthermore, the influence of the lattice defects and the like of the hard coating layer can be expressed by a change in an optical absorption spectrum. The inventors could demonstrate the relationship between the change and the cutting performance by performing various tests (details thereof will be described later).

In this embodiment, in a case where an optical absorption spectrum of the surface of the hard coating layer is measured using a spectrophotometer, Ia (%) is an average absorptance at a wavelength of 400 to 500 nm, and Ib (%) is an average absorptance at a wavelength of 600 to 700 nm, Ia−Ib, that is a difference between the average absorptances (hereinafter, referred to as "absorptance difference") is required to satisfy the relationship: Ia−Ib<5. In this description, the absorptance difference (Ia−Ib) means an absolute value (|Ia−Ib|) thereof unless otherwise stated.

Here, in a case where the absorptance difference is 5% or greater, the number of lattice defects (for example, dislocation) in the surface of the hard coating layer is small. Accordingly, since nuclei of oxides are hardly formed in the surface of the hard coating layer in a high-temperature oxidation atmosphere during cutting, oxides are hardly formed, and thus an oxidation resistance-improving effect cannot be expected. Therefore, the value of the absorptance difference (Ia−Ib) is required to satisfy Ia−Ib<5(%). In order to obtain a more excellent oxidation resistance-improving effect, the value of the absorptance difference (Ia−Ib) is preferably 0% to 3.5%, and more preferably 0% to 3.0%, but is not limited thereto.

Figure 1B:
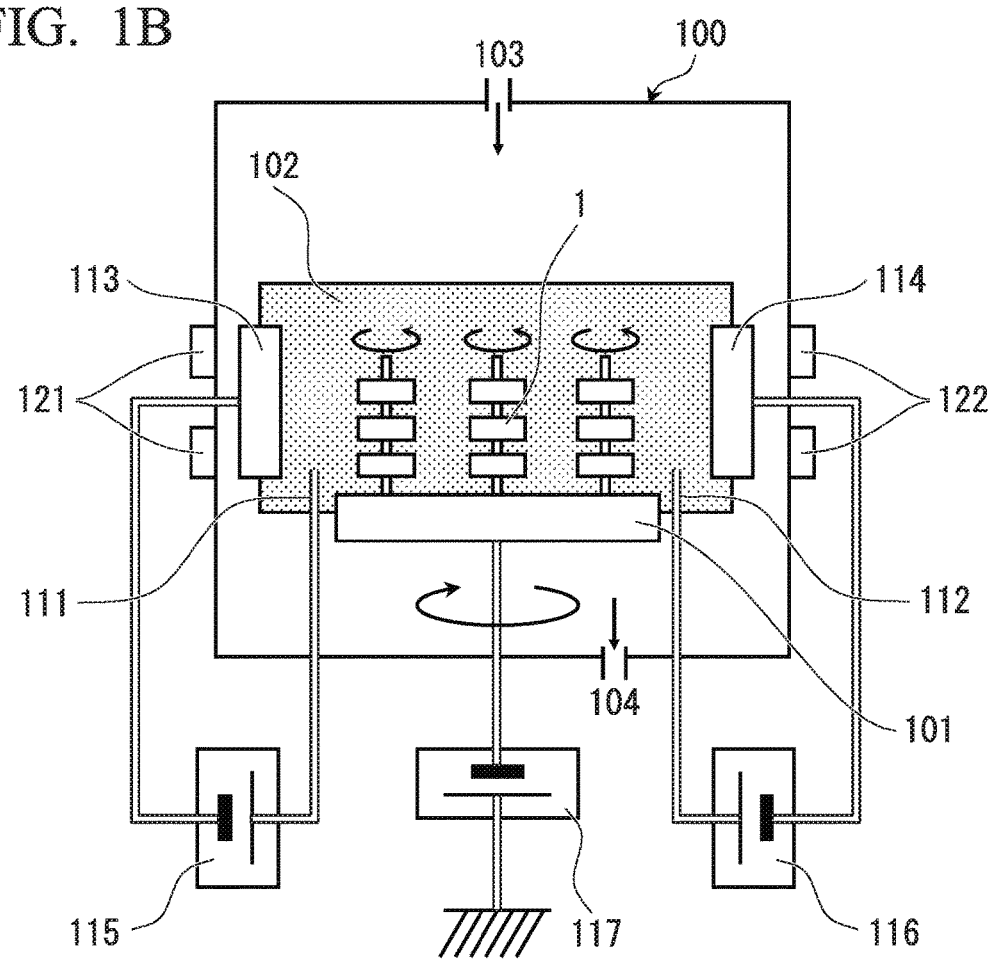
FIG. 1B is a schematic front view showing the AIP apparatus of FIG. 1A.

A hard coating layer with the above-described absorptance difference (Ia−Ib) of less than 5% set in this embodiment can be deposited by, for example, placing a magnetic force-generating source 121 such as a permanent magnet in a rear surface of a Ti—Al alloy target (cathode electrode) 113 and forming a (Ti, Al)N layer while applying a surface maximum magnetic flux density of 100 G (0.01 T) or greater to the surface of the target 113 with a controlled magnetic flux density gradient in an AIP apparatus (arc ion plating apparatus) 100 shown in FIGS. 1A and 1B.

In this case, the maximum magnetic flux density (maximum magnetic field magnetic flux density) of the surface of the target 113 is adjusted to 100 to 250 G (0.01 to 0.025 T). In a case where the maximum magnetic flux density is less than 100 G, (Ia−Ib)<5 is unlikely to be satisfied. In a case where the maximum magnetic flux density is greater than 250 G, (Ia−Ib)≥5 is satisfied. The maximum magnetic flux density of the surface of the target 113 is preferably 100 to 250 G, and more preferably 100 to 150 G, but is not limited thereto. In addition, a maximum magnetic flux density gradient when being measured within an arbitrary surface range of 10 mm on a center of the surface of the target 113 is adjusted to 6 G/mm (0.6 mT/mm) or greater. In a case where the maximum magnetic flux density gradient is less than 6 G/mm, (Ia−Ib)≥5 is established. The upper limit of this maximum magnetic flux density gradient is preferably 20 G/mm. The maximum magnetic flux density gradient is preferably 6 to 20 G/mm, and more preferably 6 to 10 G/mm, but is not limited thereto. Here, the above-described arbitrary surface range of 10 mm is a range between an arbitrary lattice point and a lattice point adjacent thereto among lattice points generated by subjecting a central portion of the target surface to lattice-like division at intervals of 10 mm.

Here, the AIP apparatus 100 of FIGS. 1A and 1B is provided with a rotation table 101 for placing a cutting tool body (cemented carbide body) 1, a heater 102 for heating the cutting tool body 1, a reaction gas inlet 103 for introducing a reaction gas, an exhaust gas outlet 104 for discharging a gas to the outside of the system, two anode electrodes 111 and 112, and two cathode electrodes 113 and 114. The anode electrode 111 and the cathode electrode (Al—Ti alloy target) 113 are connected to an arc electric power supply 115 provided outside the apparatus 100. The anode electrode 112 and the cathode electrode (Ti target) 114 are connected to an arc electric power supply 116 provided outside the apparatus 100. The rotation table 101 is connected to a bias electric power supply 117 provided outside the apparatus 100. A magnetic force-generating source 121 is provided outside the arc ion plating apparatus 100 so as to be opposed to the cathode electrode 113 with a rear surface of the cathode electrode 113, that is, a side wall of the AIP apparatus 100 interposed therebetween. Similarly, a magnetic force-generating source 122 is also provided in a rear surface of the cathode electrode 114. In the example shown in the drawings, the magnetic force-generating sources 121 and 122 are annular coil magnetic or permanent magnets.

The above-described measurement of an optical absorption spectrum of the surface of the hard coating layer using a spectrophotometer can be performed, for example, as follows.

Figure 2:
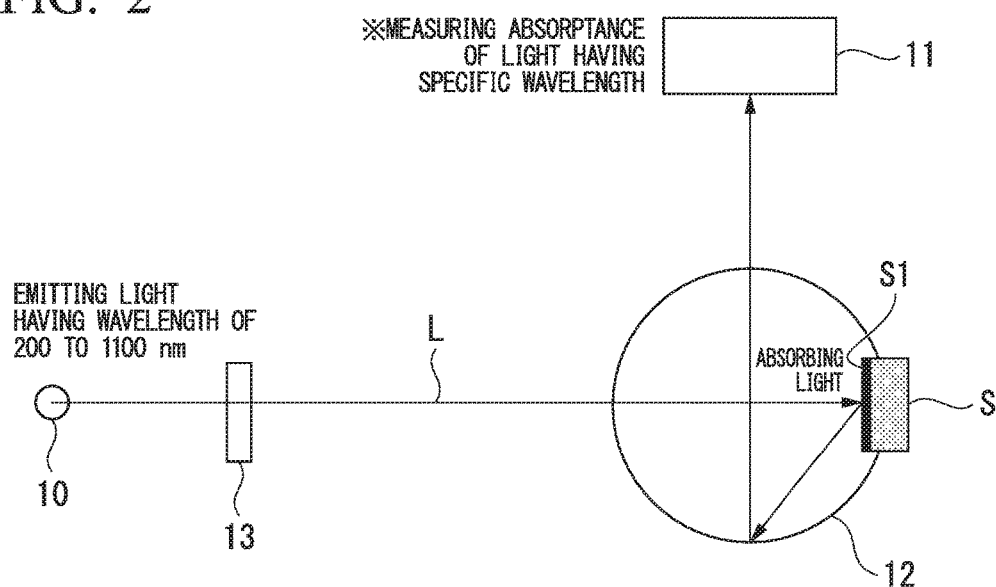
FIG. 2 is a schematic illustration of a method of measuring an optical absorption spectrum of a surface of the hard coating layer.

FIG. 2 shows a schematic illustration of a method of measuring an optical absorption spectrum of the surface of the hard coating layer.

As shown in FIG. 2, an integrating sphere 12 is installed between a light source 10 and a detector 11 of a spectrophotometer. A sample S is cut out of a coated tool and installed such that a hard coating layer surface S1 is irradiated with light L (the arrows in FIG. 2) in the integrating sphere 12. A grating 13 that diffracts only light with a specific wavelength is provided on the optical path of the irradiation light L from the light source 10 to the sample S.

Next, light L is emitted from the light source 10 into the integrating sphere while the wavelength is continuously changed from 200 nm to 1,100 nm, and an optical absorptance (attenuation rate) on the hard coating layer surface S1 at each wavelength is measured by the detector 11.

By continuously detecting the absorptance at each wavelength, an optical absorption spectrum of the hard coating layer surface can be measured.

Table 1 shows measurement samples and measurement results thereof.

Samples 1 and 2 shown in Table 1 have a hard coating layer composed of a target composition (Ti$_{0.5}$, Al$_{0.5}$)N layer deposited thereon using a target (cathode electrode 113) with a component composition of 50 atom % Ti-50 atom % Al in the AIP apparatus 100 shown in FIGS. 1A and 1B.

Here, the two types of samples were produced and used in order to examine the influence of the target surface maximum magnetic flux density (100 G or greater, or less than 40 G) and the maximum magnetic flux density gradient when being measured in an arbitrary range of 10 mm on the target surface. Here, a surface magnetic flux density was measured at intervals of 10 mm for each of lattice points generated by subjecting the target surface to lattice-like division as described above using a gaussmeter [teslameter], and among the measured surface magnetic flux densities, the maximum one was set as a target surface maximum magnetic flux density. In addition, a magnetic flux density gradient between the measured surface magnetic flux densities was calculated, and among the calculated magnetic flux density gradients, the maximum one was set as a maximum magnetic flux density gradient.

Figure 3:
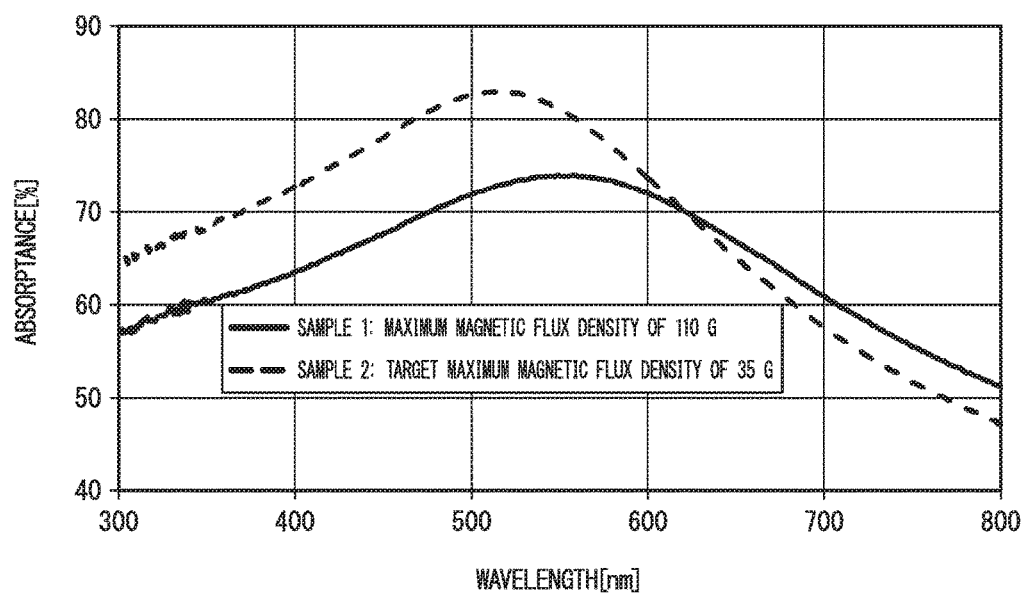
FIG. 3 shows results of the measurement of the optical absorption spectrums of surfaces of Samples 1 and 2, measured with respect to Samples 1 and 2.

FIG. 3 shows results of the measurement of the optical absorption spectrums of surfaces of Samples 1 and 2, measured with respect to Samples 1 and 2 produced in the above description.

From the results shown in FIG. 3, depending on the difference of the maximum magnetic flux densities and the difference of the maximum magnetic flux density gradients of the target surface (that is, depending on whether the maximum magnetic flux density gradient when being measured in an arbitrary range of 10 mm on the target surface was 6 G/mm or greater and a maximum magnetic flux density of 100 G or greater was applied, or the maximum magnetic flux density gradient when being measured in an arbitrary range of 10 mm on the target surface was less than 6 G/mm and a maximum magnetic flux density of less than 40 G was applied), no large difference was shown in the absorptance at a wavelength of 600 to 700 nm, but in the absorptance at a wavelength of 400 to 500 nm, a large difference was shown.

That is, in a case where light absorption coefficients of the surfaces of Samples 1 and 2 between which a large difference was shown in the absorptance at a wavelength of 400 to 500 nm were measured, Sample 1 in which the permanent magnet 121 was disposed in the rear surface of the target 113 and 100 G or greater of a maximum magnetic flux density was applied to the target surface was confirmed to have an obviously smaller absorptance at a wavelength of 400 to 500 nm than Sample 2. As will be described later, Sample 1 has an excellent oxidation resistance and wear resistance. Accordingly, it can be said that a difference between the absorptance of Sample 1 at a wavelength of 400 to 500 nm and the absorptance of Sample 1 at a wavelength of 600 to 700 nm reflects the influence of lattice defects such as dislocation present in the surface of the hard coating layer.

TABLE 1

| Sample No. | Target Surface Maximum Magnetic Flux Density (G) | Maximum Magnetic Flux Density Gradient When Being Measured in Arbitrary Range of 10 mm on Target Surface (G/mm) |
|---|---|---|
| 1 | 110 | 7 |
| 2 | 35 | 2 |

Table 2 shows average absorptances Ia at a wavelength of 400 to 500 nm, average absorptances Ib at a wavelength of 600 to 700 nm, and absorptance differences (Ia–Ib) obtained from FIG. 3 in regard to Samples 1 and 2. Regarding the respective absorptance averages, an average of absorptances measured at 100 points at intervals of 1 nm from a wavelength of 400 nm to 500 nm was indicated by Ia (%), and an average of absorptances measured at 100 points at intervals of 1 nm from a wavelength of 600 nm to 700 nm was indicated by Ib (%). In addition, Table 2 shows an Al content ratio (value of Al/(Ti+Al) in terms of atomic ratio) measured by energy dispersion X-ray analysis (EDS) in the hard coating layer composed of the target composition (Ti$_{0.5}$, Al$_{0.5}$)N layer deposited on each of Samples 1 and 2.

According to Table 2, Ia, Ib, and (Ia–Ib) were changed, but the Al content ratios of Samples 1 and 2 were almost the same. Therefore, it is found that the reason for the above-described small absorptance of Sample 1 at a wavelength of 400 to 500 nm is not the Al content ratio of the hard coating layer, but the lattice defects such as dislocation present in the surface of the hard coating layer.

Figure 4:
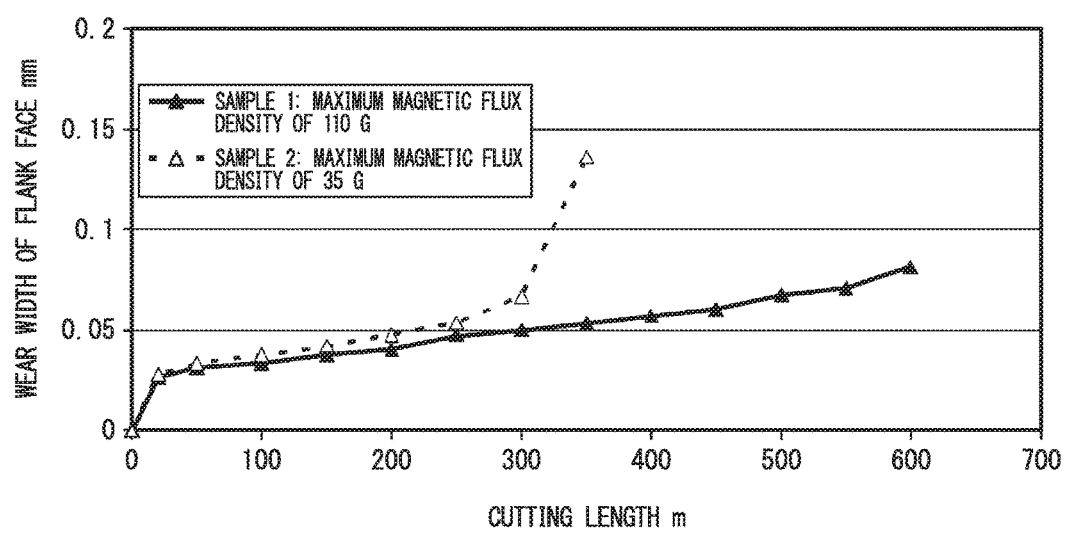
FIG. 4 shows an example of results of a cutting test using a surface-coated cutting tool according to an embodiment of the present invention.

FIG. 4 shows an example of results of a cutting test using a coated tool according to this embodiment. Conditions of the cutting test are as follows.

Tool: Two-flute ball-nosed end mill (size 3R) made of cemented carbide
Work Material: JIS SKD61 (52HRC)
Rotation Speed: 17,000 min$^{-1}$
Cutting Speed: 300 m/min
Feed speed: 1,700 mm/min
Feed rate: 0.05 mm/tooth
Depth of Cut: ae 0.3 mm (in width direction), ap 2 mm (in depth direction)
Cutting Method: Down cutting
Coolant: Air blow
Over hang: 22 mm According to the results shown in FIG. 4, it is found that the cutting performance is significantly changed depending on the difference of the maximum magnetic flux density gradients and the difference of the maximum magnetic flux densities of the target surface.

That is, the maximum magnetic flux density gradient when being measured in an arbitrary range of 10 mm on the target surface of Sample 1 was 7 G/mm, and the target surface maximum magnetic flux density was 110 G Sample 1 had excellent cutting performance (wear width of the flank face) even though the cutting length was greater than 450 m.

Regarding Sample 2, the maximum magnetic flux density gradient when being measured in an arbitrary range of 10 mm on the target surface of Sample 2 was 2 G/mm, and the target surface maximum magnetic flux density was 35 G In Sample 2, a degradation in the cutting performance was shown from the time when the cutting length was greater than 300 m.

From FIG. 4, it was found that Sample 1 in which the maximum magnetic flux density gradient when being measured in an arbitrary range of 10 mm on the target surface and the target surface maximum magnetic flux density were large had excellent cutting performance. In Sample 1 with good cutting performance, the absorptance difference (Ia–Ib) shown in Table 2 was small. Therefore, it was demonstrated that cutting performance of the hard coating layer can be obtained in a case where the absorptance difference (Ia–Ib) is within a predetermined numerical value range.

TABLE 2

| Sample No. | Ia [%] | Ib [%] | Ia – Ib [%] | Al/(Al + Ti) |
|---|---|---|---|---|
| 1 | 67.7 | 66.7 | 1.0 | 0.48 |
| 2 | 78.0 | 65.2 | 12.7 | 0.47 |

(Note)
Ia: average absorptance at 400 to 500 nm
Ib: average absorptance at 600 to 700 nm.

From the experimental facts, the hard coating layer composed of the (Ti, Al)N layer of the coated tool of this embodiment has excellent cutting performance in a case where an optical absorption spectrum is measured using a spectrophotometer and an absorptance difference (Ia–Ib) is less than 5% in a case where Ia (%) is an average absorptance at a wavelength of 400 to 500 nm and Ib (%) is an average absorptance at a wavelength of 600 to 700 nm.

This is inferred as follows. That is, in a case where lattice defects (for example, dislocation) and the like are present in the surface of the hard coating layer, oxygen atoms are easily adsorbed to the positions of the defects, and the positions become starting points for nucleus formation when oxides are formed. Therefore, oxides are easily formed in the surface of the hard coating layer. As a result, the oxidation resistance and the wear resistance of the hard coating layer are improved in a case where cutting is performed under a high-temperature oxidation atmosphere.

Next, the coated tool of the present invention will be described in more detail based on examples.

EXAMPLES

As raw material powders, a medium coarse grain-sized tungsten carbide (hereinafter, WC) powder with an average grain diameter of 5.5 µm, a WC powder with an average grain diameter of 0.8 µm, a TaC powder with an average grain diameter of 1.3 µm, a NbC powder with an average grain diameter of 1.2 µm, a ZrC powder with an average grain diameter of 1.2 µm, a $Cr_3C_2$ powder with an average grain diameter of 2.3 µm, a VC powder with an average grain diameter of 1.5 µm, a (Ti, W)C [TiC/WC=50/50 in terms of mass ratio] powder with an average grain diameter of 1.0 µm, and a Co powder with an average grain diameter of 1.8 µm were prepared. These raw material powders were respectively blended according to a blending composition shown in Table 3. Wax was further added to the blended raw material powders, mixed therewith using a ball mill for 24 hours in acetone, and then dried under reduced pressure. Thereafter, the resulting material was press-formed into various types of green compacts with a predetermined shape at a pressure of 100 MPa. These green compacts were sintered by being heated to a predetermined temperature in the range of 1370° C. to 1470° C. at a heating rate of 7° C./min in a vacuum atmosphere of 6 Pa, being held for 1 hour at the predetermined temperature, and then being cooled under furnace cooling conditions. Thereby, two types of round bar sintered materials for cemented carbide body formation with a diameter of 8 mm and a diameter of 26 mm were formed. From the above-described two types of round bar sintered materials, cutting tool bodies (end mills) 1 to 8 made of WC-based cemented carbide, having sizes of 6 mm×13 mm or 20 mm×45 mm (diameter×length of cutting edge portion according to the combination shown in Table 3) and having a four-flute square shape with a helix angle of 30 degrees, were manufactured by grinding.

(a) Each of the above-described cutting tool bodies 1 to 8 was subjected to ultrasonic cleaning in acetone and dried. In that state, the cutting tool body was mounted at a position separated by a predetermined distance in a radial direction from a central axis on the rotation table 101 in the AIP apparatus 100 shown in FIGS. 1A and 1B along an outer peripheral portion of the rotation table 101. A Ti cathode electrode (Ti target) 114 for bombardment cleaning was disposed on one side, and a target (cathode electrode) 113 made of a Ti—Al alloy with a predetermined component composition was disposed on the other side such that these were opposed to each other with the rotation table interposed therebetween.

(b) First, while the apparatus 100 was evacuated to be held in a vacuum of 0.1 Pa or less, the inside of the apparatus 100 was heated to 500° C. by the heater 102. Thereafter, a DC bias voltage of −1,000 V was applied to the cutting tool body (reference sign 1 in the drawings) rotating and revolving on the rotation table 101, and a current of 100 A was allowed to flow between the above-described Ti cathode electrode 114 and anode electrode 112 to generate arc discharge to thus subject a surface of the cutting tool body to bombardment cleaning.

(c) Next, a flow rate of a nitrogen gas as a reaction gas to be introduced into the apparatus 100 was adjusted according to a change of an Al content of Ti—Al to make a reaction atmosphere of 4 to 10 Pa, and a DC bias voltage of −250 to −50 V was applied to the cutting tool body rotating and revolving on the rotation table 101. Various magnetic flux densities shown in Table 4 were applied such that the maximum magnetic flux density gradient when being measured in an arbitrary range of 10 mm on the surface of the Ti–Al alloy target 113 was 6 G/mm or greater and the maximum magnetic flux density was in the range of 100 to 250 G. In such a state, a current of 100 A was allowed to flow between the Ti—Al alloy target 113 and the anode electrode 111 to generate arc discharge, and thus a hard coating layer composed of a (Ti, Al)N layer with a predetermined target layer thickness was deposited on each of the cutting tool bodies 1 to 8.

Through the steps (a) to (c), invention surface-coated cemented carbide end mills (hereinafter, referred to as invention coated end mills) 1 to 8 were manufactured as surface-coated cutting tools according to the present invention shown in Table 4.

For comparison, the cutting tool bodies 1 to 8 were subjected to ultrasonic cleaning in acetone and dried. In that state, the cutting tool bodies were put in the AIP apparatus shown in FIGS. 1A and 1B, and a Ti—Al alloy was mounted as a cathode electrode (evaporation source) 113. First, while the apparatus 100 was evacuated to be held in a vacuum of 0.1 Pa or less, the inside of the apparatus 100 was heated to 500° C. by the heater 102. Thereafter, a DC bias voltage of −1,000 V was applied to the cutting tool body, and a current of 100 A was allowed to flow between the Ti cathode electrode 114 and the anode electrode 112 to generate arc discharge to thus subject a surface of the cutting tool body to bombardment cleaning. Next, a nitrogen gas as a reaction gas was introduced into the apparatus 100 to make a reaction atmosphere of 4 Pa, and a bias voltage of −50 V was applied to the cutting tool body. Various magnetic flux densities shown in Table 5 were applied such that the maximum magnetic flux density gradient when being measured in an arbitrary range of 10 mm on the surface of the Ti—Al alloy target 113 was less than 6 G/mm and the maximum magnetic flux density was less than 40 G. In such a state, a current of 100 A was allowed to flow between the Ti—Al alloy cathode electrode 113 and the anode electrode 111 to generate arc discharge, and thus a hard coating layer composed of a (Ti, Al)N layer with a target layer thickness was deposited on the surface of each of the cutting tool bodies 1 to 8. Accordingly, comparative surface-coated cemented carbide end mills (hereinafter, referred to as comparative coated end mills) 1 to 8 shown in Table 5 were manufactured.

A part of each of the invention coated end mills 1 to 8 and the comparative coated end mills 1 to 8 was cut out to produce a sample for optical absorption spectrum measurement. Using this sample, the absorptance of the surface of the hard coating layer composed of the (Ti, Al)N layer was measured according to the above-described optical absorption spectrum measurement method shown in FIG. 2.

From the measured values, an average absorptance Ia (%) at a wavelength of 400 to 500 nm, an average absorptance Ib (%) at a wavelength of 600 to 700 nm, and an absorptance difference (Ia−Ib) were calculated and obtained.

The specific calculation method is as follows. The absorptance was measured at intervals of 1 nm in a range of a wavelength from 400 nm to 500 nm and from 600 nm to 700 nm. An average of absorptances measured at 100 points at intervals of 1 nm from a wavelength of 400 nm to 500 nm was indicated by Ia (%), and an average of absorptances measured at 100 points at intervals of 1 nm from a wavelength of 600 nm to 700 nm was indicated by Ib (%).

The values thereof are shown in Tables 4 and 5.

The value of the maximum magnetic flux density (G) of the target surface and the value of the maximum magnetic flux density gradient (G/mm) when being measured in an arbitrary range of 10 mm on the target surface, which were the film-forming conditions in the production of each of the invention coated end mills 1 to 8 and the comparative coated end mills 1 to 8, are also shown in Tables 4 and 5.

The Al content of the hard coating layer composed of the (Ti, Al)N layer of each of the invention coated end mills 1 to 8 and the comparative coated end mills 1 to 8 was obtained as an average of values measured at 5 points using EPMA.

The average layer thickness of the (Ti, Al)N layer of the hard coating layer was obtained as an average of values measured at 5 places by cross-sectional measurement using a scanning electron microscope.

The values thereof are shown in Tables 4 and 5.

TABLE 3

| Type | | Co | (Ti, W)C | TaC | NbC | ZrC | $Cr_3C_2$ | VC | WC | Diameter × Length of Cutting Edge Portion (mm) |
|---|---|---|---|---|---|---|---|---|---|---|
| | | | | Blending Composition (mass %) | | | | | | |
| Cutting Tool Body (End mill) | 1 | 5 | 5 | — | — | — | — | — | Medium coarse grain: Balance | 6 × 13 |
| | 2 | 6 | — | 1 | 0.5 | — | — | — | Fine grain: Balance | 6 × 13 |
| | 3 | 6 | — | 1 | — | 1 | 0.5 | 0.5 | Fine grain: Balance | 6 × 13 |
| | 4 | 8 | — | — | — | — | 0.5 | 0.5 | Fine grain: Balance | 6 × 13 |
| | 5 | 10 | — | — | — | — | 0.5 | 0.5 | Fine grain: Balance | 6 × 13 |
| | 6 | 9 | 25 | 10 | 1 | — | — | — | Medium coarse grain: Balance | 20 × 45 |
| | 7 | 10 | — | — | — | — | 1 | — | Fine grain: Balance | 20 × 45 |
| | 8 | 12 | 17 | 9 | 1 | — | — | — | Medium coarse grain: Balance | 20 × 45 |
| | 9 | 16 | — | 10 | 5 | 10 | — | — | Medium coarse grain: Balance | 20 × 45 |
| | 10 | 12 | — | — | — | — | 0.5 | 0.5 | Fine grain: Balance | 20 × 45 |

TABLE 4

| Type | | Cutting Tool Body No. | Value of Al/(Ti + Al) (X value) | Crystal Structure | Average Layer Thickness of (Ti, Al)N Layer (μm) | Target Surface Maximum Magnetic Flux Density (G) | Maximum Magnetic Flux Density Gradient When Being Measured in Arbitrary Range of 10 mm on Target Surface (G/mm) | Absorption Spectrum Characteristics of Surface | | Absorptance Difference Ia − Ib |
|---|---|---|---|---|---|---|---|---|---|---|
| | | | | | | | | Average Absorptance Ia (%) at Wavelength of 400 to 500 nm | Average Absorptance Ib (%) at Wavelength of 600 to 700 nm | |
| Invention Coated End Mill | 1 | 1 | 0.55 | Cubic | 7.2 | 94.6 | 6.0 | 65.2 | 61.8 | 3.4 |
| | 2 | 2 | 0.48 | Cubic | 10.0 | 99.1 | 6.3 | 78.3 | 75.6 | 2.7 |
| | 3 | 3 | 0.45 | Cubic | 3.7 | 115.8 | 7.4 | 70.3 | 70.2 | 0.1 |
| | 4 | 4 | 0.57 | Cubic | 2.2 | 119.6 | 7.6 | 72.7 | 73.2 | −0.5 |
| | 5 | 5 | 0.60 | Cubic | 5.5 | 148.2 | 9.8 | 71.7 | 67.4 | 4.3 |
| | 6 | 6 | 0.50 | Cubic | 6.7 | 85.6 | 6.0 | 62.3 | 57.5 | 4.8 |
| | 7 | 7 | 0.63 | Cubic | 0.5 | 108.1 | 6.9 | 74.2 | 72.9 | 1.3 |
| | 8 | 8 | 0.65 | Cubic | 4.8 | 97.8 | 6.2 | 76.1 | 73.2 | 2.9 |
| | 9 | 9 | 0.68 | Cubic | 3.0 | 122.8 | 7.9 | 67.2 | 68.2 | −1.0 |
| | 10 | 10 | 0.66 | Cubic | 4.3 | 249.3 | 19.2 | 70.8 | 69 | 1.8 |

TABLE 5

| | | | | | | Maximum Magnetic Flux Density Gradient | Absorption Spectrum Characteristics of Surface | | |
|---|---|---|---|---|---|---|---|---|---|
| | | | | | Target | | | | |
| Type | | Cutting Tool Body No. | Value of Al/(Ti + Al) (X value) | Crystal Structure | Average Layer Thickness of (Ti, Al)N Layer (μm) | Surface Maximum Magnetic Flux Density (G) | When Being Measured in Arbitrary Range of 10 mm on Target Surface (G/mm) | Average Absorptance Ia (%) at Wavelength of 400 to 500 nm | Average Absorptance Ib (%) at Wavelength of 600 to 700 nm | Absorptance Difference Ia − Ib |
| Comparative Coated End Mill | 1 | 1 | 0.55 | Cubic | 9.6 | 78.6 | 4.9 | 67.2 | 61.3 | 5.9 |
| | 2 | 2 | 0.46 | Cubic | 5.6 | 24.7 | 1.3 | 75.2 | 60.8 | 14.4 |
| | 3 | 3 | 0.52 | Cubic | 1.2 | 76.7 | 4.8 | 64.2 | 58.0 | 6.2 |
| | 4 | 4 | 0.63 | Cubic | 3.1 | 50.4 | 3.0 | 70.3 | 60.8 | 9.5 |
| | 5 | 6 | 0.43 | Cubic | 2.9 | 8.7 | 0.2 | 80.2 | 63.4 | 16.8 |
| | 6 | 7 | 0.60 | Cubic | 2.4 | 66.4 | 4.1 | 67.2 | 59.4 | 7.8 |
| | 7 | 8 | 0.50 | Cubic | 7.2 | 36.3 | 2.1 | 79.5 | 67.0 | 12.5 |
| | 8 | 9 | 0.67 | Cubic | 4.7 | 55.5 | 3.4 | 62.2 | 52.7 | 9.5 |

Next, a dry high-speed slot milling test of alloy tool steel was performed using the invention coated end mills 1 to 4 and the comparative coated end mills 1 to 4 among the invention coated end mills 1 to 8 and the comparative coated end mills 1 to 8 under the following conditions.

Work Material: Plate of JTS SKD61 (HRC52) defined in JIS 4404: 2006 (corresponding to ISO 4957:1999) having a plane size of 100 mm×250 mm and a thickness of 50 mm
  Cutting Speed: 300 m/min
  Groove Depth (depth of cut): ae 0.3 mm, ap 2 mm
  Feed Speed: 1,700 mm/min A dry high-speed slot milling test of alloy tool steel was performed using the invention coated end mills 5 to 8 and the comparative coated end mills 5 to 8 under the following conditions.

Work Material: Plate of JIS•SKD61 having a plane size of 100 mm×250 mm and a thickness of 50 mm
  Cutting Speed: 300 m/min
  Groove Depth (depth of cut): ae 0.3 mm, ap 2 mm
  Feed Speed: 1,700 mm/min In any of the above-described slot milling tests, a cutting length was measured when the wear width of the flank face of the peripheral cutting edge of the cutting edge portion reached 0.1 mm, which indicates that the tool life has ended.

The measurement results thereof are shown in Table 6.

TABLE 6

| Type | | Cutting Length (m) | Type | | Cutting Length (m) |
|---|---|---|---|---|---|
| Invention Coated End Mill | 1 | 150 | Comparative Coated End Mill | 1 | 85 |
| | 2 | 120 | | 2 | 45 |
| | 3 | 120 | | 3 | 40 |
| | 4 | 160 | | 4 | 50 |
| | 5 | 150 | | 5 | 65 |
| | 6 | 130 | | 6 | 55 |
| | 7 | 110 | | 7 | 70 |
| | 8 | 140 | | 8 | 35 |
| | 9 | 170 | | | |
| | 10 | 160 | | | |

From the results shown in Tables 4 to 6, in the case of the invention coated end mills 1 to 8, in the measurement of an optical absorption spectrum of the surface of the hard coating layer composed of the (Ti, Al)N layer, an average absorptance Ia (%) at a wavelength of 400 to 500 nm and an average absorptance Ib (%) at a wavelength of 600 to 700 nm satisfied a predetermined relationship: Ia−Ib<5. Therefore, even in a case where the cutting is performed under a high-temperature oxidation atmosphere, the invention coated end mills 1 to 8 exhibit excellent wear resistance in long-term usage with no deterioration in film characteristics since these have excellent oxidation resistance.

In contrast, in the comparative coated end mills 1 to 8 in which the average absorptances Ia (%) and Ib (%) of the optical absorption spectrum of the surface of the hard coating layer do not satisfy the relationship: Ia−Ib<5, it is obvious that due to the deterioration of film characteristics under cutting conditions in a high-temperature oxidation atmosphere, the wear resistance is deteriorated and end of the tool life is reached after a relatively short period of time.

The examples show effects of the case where the hard coating layer is a single layer. However, the effects are exhibited also in a case where the film of the present invention ((Ti, Al)N layer) and another film are combined. For example, the effects are exhibited even in a case where a multiple layer structure of (Ti, Al)N and a nitride such as TiN, Ti(C, N), or (Al, Cr)N, $Al_2O_3$, an amorphous carbon film, or the like is made, or these films are alternatively laminated. In a case where the film of the present invention is combined with another film, the film of the present invention ((Ti, Al)N layer) is preferably formed as an outermost layer of the hard coating layer in order to exhibit excellent oxidation resistance.

INDUSTRIAL APPLICABILITY

Even in a case where the cutting is performed under a high-temperature oxidation atmosphere, a surface-coated cutting tool of the present invention exhibits excellent wear resistance in long-term usage with no deterioration in film characteristics since it has excellent oxidation resistance. Accordingly, it is possible for the coated tool to sufficiently satisfactorily cope with power saving, energy saving, and cost reduction in cutting in addition to an improvement in performance of the cutting machine tool.

REFERENCE SIGNS LIST

1: CUTTING TOOL BODY
100: ARC ION PLATING APPARATUS (AIP APPARATUS)
101: ROTATION TABLE

102: HEATER
103: REACTION GAS INLET
104: EXHAUST GAS OUTLET
111: ANODE ELECTRODE
112: ANODE ELECTRODE
113: CATHODE ELECTRODE
114: CATHODE ELECTRODE
115: ARC ELECTRIC POWER SUPPLY
116: ARC ELECTRIC POWER SUPPLY
117: BIAS ELECTRIC POWER SUPPLY
121: MAGNETIC FORCE-GENERATING SOURCE
122: MAGNETIC FORCE-GENERATING SOURCE

The invention claimed is:

1. A surface-coated cutting tool, comprising: a cutting tool body made of tungsten carbide-based cemented carbide; and a hard coating layer deposited on a surface of the cutting tool body, wherein (a) the hard coating layer has at least one (Ti, Al)N layer with an average layer thickness of 0.5 to 10 μm, in a case where a composition of the (Ti, Al)N layer is expressed by a composition formula: $(Ti_{1-x}Al_x)N$, X is an atomic ratio which satisfies $0.4 \leq X \leq 0.7$, and the (Ti, Al)N layer has a cubic crystal structure, and (b) in a case where an optical absorption spectrum of a surface of the hard coating layer is measured using a spectrophotometer, Ia (%) is an average absorptance at a wavelength of 400 to 500 nm, Ib (%) is an average absorptance at a wavelength of 600 to 700 nm, and (Ia–Ib)<5 is satisfied, and wherein the hard coating layer is produced such that a maximum magnetic flux density gradient when being measured in an arbitrary surface range of 10 mm at a center of a surface of a Ti—Al alloy target is 6 G/mm or greater.

2. The surface-coated cutting tool according to claim 1, wherein the hard coating layer is produced such that a maximum magnetic field magnetic flux density is in the range of 100 to 250 G.

3. A method of manufacturing a surface-coated cutting tool including a cutting tool body made of tungsten carbide-based cemented carbide and a hard coating layer deposited on a surface of the cutting tool body, wherein the hard coating layer has at least one (Ti, Al)N layer, the method comprising: depositing the (Ti, Al)N layer on the surface of the cutting tool body using the Ti—Al alloy target while a maximum magnetic flux density gradient when being measured in an arbitrary surface range of 10 mm at a center of a surface of a Ti—Al alloy target is adjusted to 6 G/mm or greater and a maximum magnetic field magnetic flux density is adjusted to 100 to 250 G.

\* \* \* \* \*